(12) United States Patent
Dunn et al.

(10) Patent No.: US 8,692,288 B2
(45) Date of Patent: Apr. 8, 2014

(54) HETEROJUNCTION BIPOLAR TRANSISTORS AND METHODS OF MANUFACTURE

(75) Inventors: James S. Dunn, Jericho, VT (US); Alvin J. Joseph, Williston, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/529,625

(22) Filed: Jun. 21, 2012

(65) Prior Publication Data

US 2012/0261719 A1    Oct. 18, 2012

Related U.S. Application Data

(62) Division of application No. 12/539,284, filed on Aug. 11, 2009, now Pat. No. 8,237,191.

(51) Int. Cl.
*H01L 27/06* (2006.01)
*H01L 21/8248* (2006.01)

(52) U.S. Cl.
USPC .... 257/140; 257/183; 257/192; 257/E27.015; 257/E21.695; 438/138; 438/118; 438/637; 438/638; 438/235

(58) Field of Classification Search
USPC .......... 257/140, 183, 192, E27.015, E21.695; 438/138, 118, 637, 638, 235
See application file for complete search history.

(56) References Cited

U.S. PATENT DOCUMENTS

| 5,012,318 | A | 4/1991 | Honjo | |
|---|---|---|---|---|
| 5,945,155 | A * | 8/1999 | Grill et al. | 427/122 |
| 6,191,029 | B1 | 2/2001 | Hsiao et al. | |
| 6,259,160 | B1 * | 7/2001 | Lopatin et al. | 257/762 |
| 6,271,135 | B1 | 8/2001 | Palmans et al. | |
| 6,376,353 | B1 | 4/2002 | Zhou et al. | |
| 6,449,442 | B1 | 9/2002 | Shida et al. | |
| 6,457,234 | B1 | 10/2002 | Edelstein et al. | |
| 6,482,711 | B1 * | 11/2002 | Nguyen et al. | 438/317 |
| 6,727,593 | B2 * | 4/2004 | Toyoda et al. | 257/762 |
| 6,893,959 | B2 * | 5/2005 | Barth | 438/637 |
| 7,023,093 | B2 | 4/2006 | Canaperi et al. | |
| 7,045,453 | B2 | 5/2006 | Canaperi et al. | |
| 7,084,060 | B1 | 8/2006 | Furukawa et al. | |
| 7,084,062 | B1 | 8/2006 | Avanzino et al. | |
| 7,084,479 | B2 | 8/2006 | Chen et al. | |
| 7,241,696 | B2 | 7/2007 | Clevenger et al. | |
| 7,309,649 | B2 | 12/2007 | Colburn et al. | |
| 7,550,822 | B2 | 6/2009 | Lee et al. | |
| 8,399,989 | B2 | 3/2013 | Lin et al. | |
| 2003/0139034 | A1 | 7/2003 | Yuang et al. | |

(Continued)

OTHER PUBLICATIONS

Office Action for related U.S. Appl. No. 13/438,508 dated Jul. 30, 2012.

(Continued)

*Primary Examiner* — Lex Malsawma
*Assistant Examiner* — Sheng Zhu
(74) *Attorney, Agent, or Firm* — Richard Kotulak; Roberts Mlotkowski Safran & Cole, P.C.

(57) ABSTRACT

Semiconductor structures and methods of manufacture semiconductors are provided which relate to heterojunction bipolar transistors. The structure includes two devices connected by metal wires on a same wiring level. The metal wire of a first of the two devices is formed by selectively forming a metal cap layer on copper wiring structures.

17 Claims, 4 Drawing Sheets

(56) References Cited

U.S. PATENT DOCUMENTS

| | | |
|---|---|---|
| 2006/0063392 A1 | 3/2006 | Ventzek et al. |
| 2006/0254504 A1* | 11/2006 | Dai et al. ............... 117/84 |
| 2007/0190692 A1* | 8/2007 | Erturk et al. ............ 438/118 |
| 2007/0202610 A1 | 8/2007 | Chiang et al. |
| 2007/0249156 A1 | 10/2007 | Bonilla et al. |
| 2007/0287294 A1 | 12/2007 | Ko et al. |
| 2008/0026541 A1 | 1/2008 | Edelstein et al. |
| 2008/0111154 A1* | 5/2008 | Voldman ............... 257/192 |
| 2008/0282366 A1 | 11/2008 | Behm |
| 2009/0212437 A1* | 8/2009 | Kumagai et al. ............ 257/762 |
| 2010/0059833 A1 | 3/2010 | Yu et al. |

OTHER PUBLICATIONS

Final Office Action for related U.S. Appl. No. 13/438,508 dated Nov. 15, 2012.

Notice of Allowance for related U.S. Appl. No. 13/438,508 dated Aug. 20, 2013.

* cited by examiner

HETEROJUNCTION BIPOLAR TRANSISTORS AND METHODS OF MANUFACTURE

CROSS REFERENCE TO RELATED APPLICATIONS

This application is a divisional application of U.S. application Ser. No. 12/539,284, filed on Aug. 11, 2009, the contents of which are incorporated by reference in their entirety herein.

FIELD OF THE INVENTION

The invention relates to semiconductor structures and methods of manufacture and, more particularly, to heterojunction bipolar transistors and methods of manufacture.

BACKGROUND

Heterojunction bipolar transistors (HBT) are used in SiGe technologies due to their high performance (Ft, Fmax) and capabilities of driving high currents. However, SiGe HBTs have scaled poorly with newer generations, due to degradation in maximum allowed current density in the Cu wiring (i.e., electromigration limits), which require the use of multiple levels of wide wires. SiGe HBT performance is also limited by the maximum current flow out of the emitter and collector.

Solutions to the electromigration issues have given rise, though, to other issues such as, for example, poor Time-Dependent Dielectric Breakdown (TDDB) lifetime, wire RC variability, and poor yield. For example, in known solutions, wiring is provided to the emitter through M1-M2 and the collector (and base) through M1, with wide wires fanning out. These types of layouts add extra contact area in which known problems can be exacerbated by self-heating and extreme use conditions of SiGe HBT chips (i.e., need to support >125° C.). In other solutions, the HBT is widened to allow for more CABAR (ContAct BAR) or card enable signal CE (bar); however, widening the HBT increases the footprint and chip cost, and also degrades device performance. Also, known solutions cause TDDB reliability problems in minimum spaces wires or in chips with large areas. Other solutions increase wire resistance (e.g., about 2× for 90 nm M1) and wire resistance variability.

Accordingly, there exists a need in the art to overcome the deficiencies and limitations described hereinabove.

SUMMARY

In a first aspect of the invention, a method comprises forming two devices connected by metal wires on a same wiring level, the metal wire of a first of the two devices being formed by selectively forming a metal cap layer on copper wiring structures. In embodiments, one of the devices is a transistor such that the selectively forming a metal cap layer on copper wiring structures comprises electrically connecting to an emitter, collector and base of a heterojuncture bipolar transistor.

In another aspect of the invention, a method of forming a semiconductor comprises: forming an emitter, base and collector of a HBT; forming a field effect transistor (FET) adjacent to the HBT; forming wiring structures in electrical connection to the FET and the emitter, base, and collector of the HBT; forming copper wiring layers in electrical connection to the wiring structures; and selectively forming a metal conductive material on the wiring structures in electrical connection of the emitter, base and collector.

In yet another aspect of the invention, a structure comprises an HBT comprising a collector, base and emitter and wiring structures in electrical connection with the collector, base and emitter. The structure further comprises a copper cap layer deposited on the wiring structures and a selective metal to copper deposited on the copper cap layer. The structure further comprises a FET adjacent to the HBT, where the FET includes a copper wiring structure devoid of the selective metal.

In another aspect of the invention, there is a design structure tangibly embodied in a machine readable medium used for designing, manufacturing, or testing an integrated circuit. The design structure includes the method steps and/or structure of the present invention.

In another aspect of the invention, a structure comprises a first device connected to a metal wire comprising a metal cap layer on copper wiring structures. The structure further comprises a second device connected to a metal wire on a same level as the metal wire of the first device. The metal wire of the second device is devoid of the metal cap layer on copper wiring structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to heterojunction bipolar transistors (HBT) and methods of manufacture. In embodiments, the present invention increases electromigration lifetime of the HBT by selectively patterning and wiring wires only in the HBT region. In more specific embodiments, the present invention comprises selectively placing capped wiring (e.g., copper wiring capped with TaN, TiN, CoWP, Sn, or other metal that improves electromigration) to the SiGe HBT high current terminals to allow for higher current density, a tighter pitch layout, and/or elimination of staggered M1 and M2 wiring. In this way, advantageously, the present invention provides increased SiGe HBT performance by maximizing current flow out of the emitter and collector region, while minimizing space requirements. Additionally, the present invention minimizes Time-Dependent Dielectric Breakdown (TDDB). The present invention also improves the performance of the HBT by locally integrating TaN, TiN, CoWP or Sn (or other metals discussed below) to the SiGe HBT without affecting other wiring on the chip.

Figure 1:
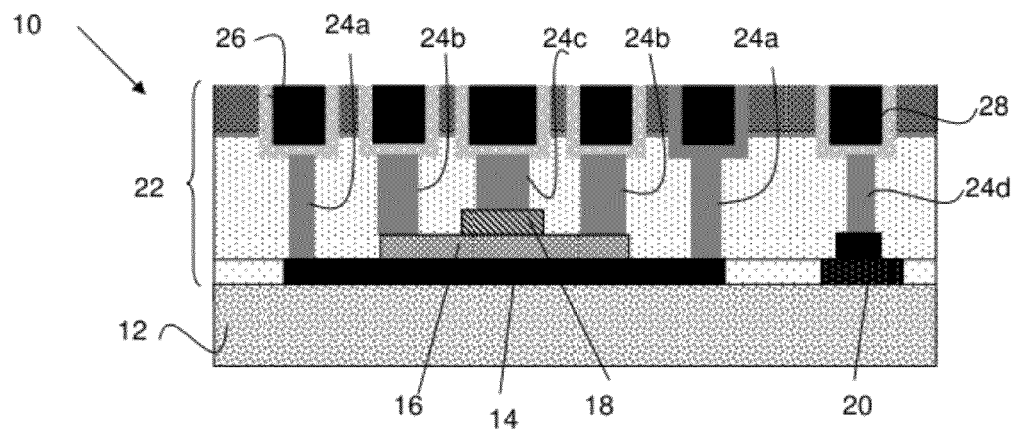
FIGS. 1-3 show structures and respective processes in accordance with aspects of the invention.

FIG. 1 shows a starting structure 10 in accordance with an aspect of the invention (e.g., SiGe BiCMOS wafer, post M1 copper processing). The structure 10 includes an HBT region comprising a collector 14, SiGe base 16 and emitter 18, formed over a substrate 12. Wiring structures 24a are formed in a layer of dielectric 22, and are electrically connected to the collector 14 of the HBT. Contact structures 24b are formed in the dielectric 22, and are electrically connected to the SiGe base 16 of the HBT. A contact structure 24c is also formed in the dielectric 22, and is electrically connected to the emitter 18 of the HBT. In embodiments, the contact structures 24a, 24b and 24c can be, for example, damascene tungsten stud contacts with thin TiN liner; damascene copper stud contacts with a Ta-based liner; or dual damascene tungsten or copper contacts formed in conjunction with the damascene M1 layer 28. In embodiments, the contact structures 24a, 24b and 24c are formed using conventional damascene or dual damascene lithographic, etching and deposition processes, well known to those of skill in the art such that further explanation is not required herein for an understanding of the present invention. The first wiring level (M1) 28 is formed using either copper single or dual damascene processing, with thin refractory metal liners, such as Ta-based metals, as known in the art. If the first wiring level (M1) 28 is formed with dual-damascene processing, then the contact structures 24a, 24b, and 24c would be formed of dual-damascene copper.

Still referring to FIG. 1, a wiring layer 26 is formed in the dielectric 22, and is electrically connected to each of the wiring structures 24a, 24b and 24c. In embodiments, the wiring layer 26 can be, for example, a damascene copper wire lined with a thin layer of refractory metal, such as TaN. In embodiments, the wiring layer 26 is formed using conventional lithographic, etching and deposition processes, well known to those of skill in the art such that further explanation is not required herein for an understanding of the present invention. The wiring layer 26 may be, for example, about 190 nm in height; although other dimensions are also contemplated by the invention. For example, the height of the wiring layer 26 may be 190 nm +/−20%.

The structure 10 further includes an optional conventional field effect transistor (FET) 20 having a dedicated wiring structure 24d electrically connected thereto. The wiring structure 24d is electrically connected to a wiring layer 28 and can be, for example, tungsten or titanium. The wiring structure 24d can be, in embodiments, lined with a titanium nitride liner, and formed using conventional lithographic, etching polishing, and deposition processes. The wire layer 28 can be copper and may be, for example, about 190 nm in height; although other dimensions are also contemplated by the invention as noted above.

Figure 2:
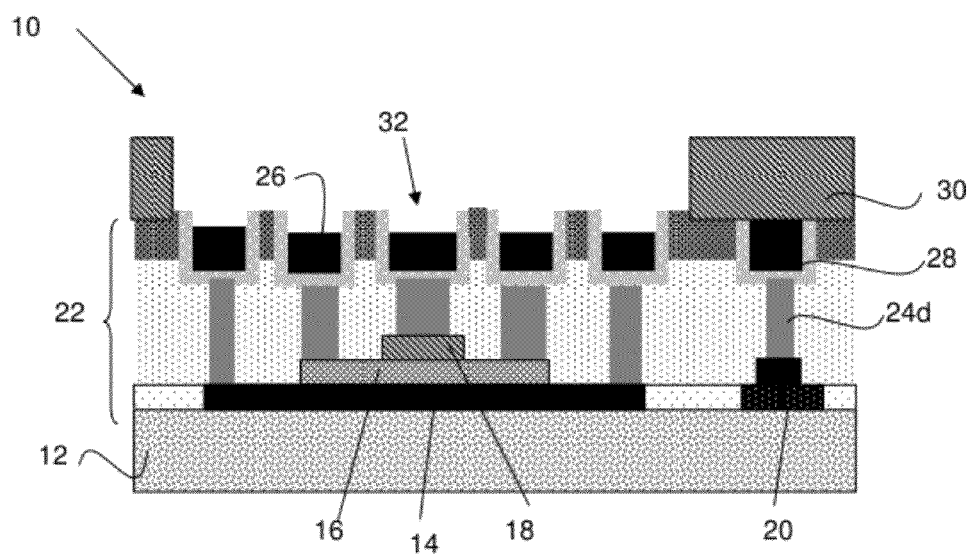

FIG. 2 shows an intermediate structure and respective processing steps in accordance with as aspect of the invention. In particular, a photoresist layer 30, which may include antireflective layers under and/or over as known in the art, is deposited on the structure 10 of FIG. 1. An opening is formed in the photoresist 30 over the HBT region of the structure 10 to expose the wiring layer 26. The copper portion of wiring layer 26 on each of the wiring structures 24a, 24b and 24c is etched using, for example, dilute sulfuric acid/hydrogen peroxide (DSP) solution to form a trench 32 over the HBT region. The trenches 32 can be approximately 40 nm in depth; although other dimensions are also contemplated by the present invention. For example, the depth of the trenches 32 can be about 40 nm +/−10%. The wiring layer 28 in areas outside the opening in the photoresist remain protected (e.g., intact) by the mask layer during the etching process.

Figure 3:
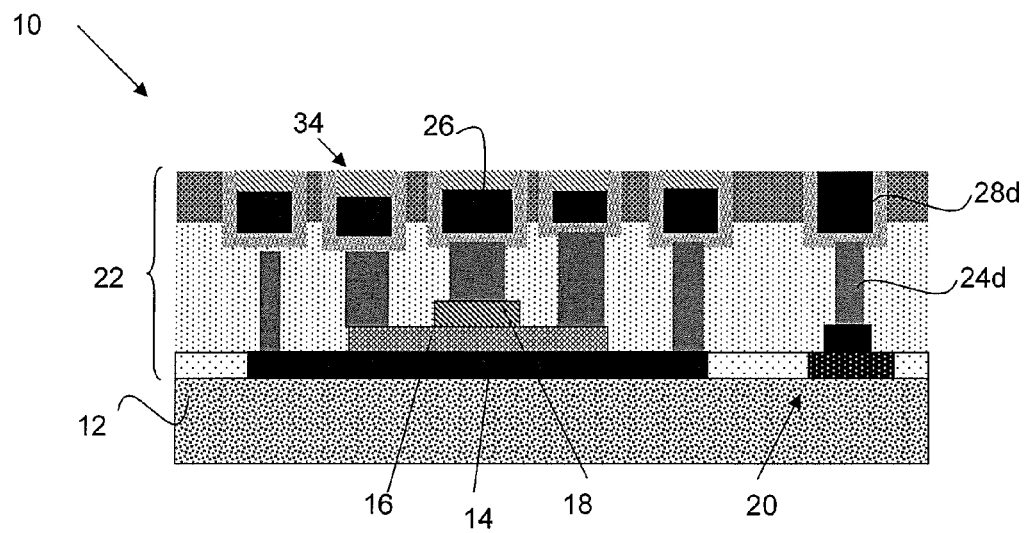

FIG. 3 shows a final structure and respective processing steps in accordance with an aspect of the invention. In particular, the photoresist is removed using, for example, a plasma or downstream plasma resist strip using a $N_2/H_2$ gas solution. In embodiments, the ambient resist is an oxygen free plasma strip which prevents corrosion of the copper layer 26.

The structure can be optionally cleaned after resist strip using, for example, a Dilute Hydrofluoric Acid (DHF).

After cleaning, a metal 34 is deposited in the trenches. The metal can be, for example, TaN, TaN/Ta, Ru, W, Mn, or TiN, deposited to a height of about 60 nm; although other dimensions are contemplated by the invention depending on the depth of the trenches. The deposition process can be, for example, be preceded by an argon or reactive hydrogen sputter clean, as known in the art, and a PVD deposition process which deposits the metal 34 on the HBT high current terminals (e.g., wiring structures 24a, 24b and 24c). In embodiments, the metal 34 selectively increases electromigration lifetime of the HBT by eliminating the fast diffusion path along the wire top surface which would be in contact with the dielectric copper cap layer, allows for tighter pitch layout and the elimination of staggered M1 and M2 wiring, while minimizing Time-Dependent Dielectric Breakdown. The structure of FIG. 3 is polished using, for example, a chemical mechanical polishing (CMP), and brush cleaned.

Figure 4:
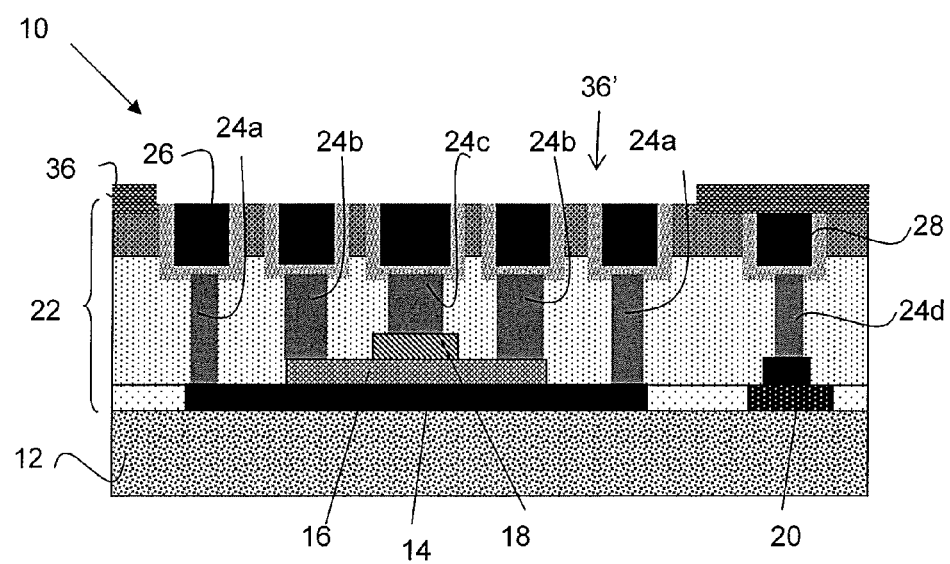
FIGS. 4 and 5 show structures and respective processes in accordance with additional aspects of the invention.

FIG. 4 shows a beginning structure in accordance with another aspect of the invention. Similar to FIG. 1, the structure 10 includes an HBT region comprising a collector 14, SiGe base 16 and emitter 18, formed on a substrate 12. Wiring structures 24a are formed in a layer of dielectric 22, and are electrically connected to the collector 14 of the HBT. Wiring structures 24b are formed in the dielectric 22, and are electrically connected to the SiGe base 16 of the HBT. A wiring structure 24c is also formed in the dielectric 22, and is electrically connected to the emitter 18 of the HBT. In embodiments, the wiring structures 24a, 24b and 24c can be, for example, tungsten or titanium nitride lined tungsten stud contacts.

Still referring to FIG. 4, a damascene wiring layer 26 is formed in another layer of the dielectric 22, and is electrically connected to each of the wiring structures 24a, 24b and 24c. In embodiments, the wiring layer 26 can be, for example, TaN lined copper. The wiring layer 26 may be, for example, about 190 nm in height; although other dimensions are also contemplated by the invention. For example, the height of the wiring layer 26 may be 190 nm +/−20%.

The structure 10 further includes a conventional field effect transistor (FET) 20 having a dedicated wiring structure 24d electrically connected thereto. The wiring structure 24d is also electrically connected to a wiring layer 28. The wiring structure 24d can be, for example, tungsten or titanium nitride lined tungsten stud contacts, and the wiring layer 28 can be TaN lined copper. The wiring layer 28 may be, for example, about 190 nm in height; although other dimensions are also contemplated by the invention. For example, the height of the wiring layer 28 may be about 190 nm +/−20%.

Still referring to FIG. 4, a masking layer 36 is deposited on the structure. In embodiments, the masking layer 36 can be, for example, SiCN which is deposited using conventional PECVD deposition processes preceded by an ammonia plasma copper surface treatment, or a self-aligned copper silicide surface treatment, as known in the art. In embodiments, the height of the masking layer is about 35 nm; although, other dimensions are also contemplated by the invention such as, for example, 25 nm. The masking layer 36 is patterned using conventional lithographic and etching processes to form an opening 36' over the HBT region. That is, the opening 36' exposes a top portion of the wiring layer 26, while protecting the FET (and more particularly protecting the wiring layer 28). The exposed surface can be stripped of photoresist using a non-oxygen containing plasma as discussed supra (e.g., an oxygen free environment so as to not corrode the exposed copper) and cleaned using, for example, a 100:1 dilute HF acid solution to prepare the surface for subsequent processing steps.

Figure 5:
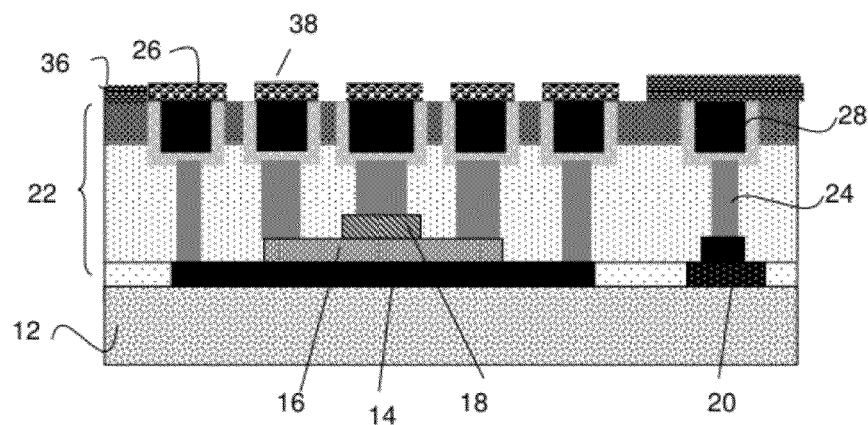

As shown in FIG. 5, a metal layer 38 is selectively deposited on the exposed copper wiring layer 26. In embodiments, the metal layer 38 is CoWP or other metal that is selectively plated to copper. Alternatively, the metal layer 38 could be selectively deposited using a CVD process and could consist of Sn, In, or W. The metal layer 38 is about 25 nm in height; although, other dimensions are also contemplated by the present invention. In embodiments, the metal layer 38 selectively increases electromigration lifetime of the HBT by eliminating the fast diffusion path along the copper surface, allows for tighter pitch layout and the elimination of staggered M1 and M2 wiring, while minimizing Time-Dependent Dielectric Breakdown.

In an alternative embodiment, a layer of Sn can be deposited on the structure of FIG. 4 (e.g., over the wiring layer 26 and spaces therebetween). The Sn can be annealed at high temperature (e.g., about above 800° C.) to form a CuSn alloy and unreacted Sn can be removed by a wet etching process (e.g., Sn on the dielectric). In this way, remaining Sn (as represented by metal layer 38 of FIG. 5) will remain on the wiring layer 26. The structure can then be cleaned in a conventional manner. In any embodiment, the relaxed spacing rules used inside the window (HBT region) will eliminate TDDB or yield issues. Although only one copper wiring level (M1) is shown with the local capping layer, additional layers of wires could be locally capped; or only levels above the first copper wiring level (M1) could be capped (e.g. M2, M7, etc.).

Figure 6:
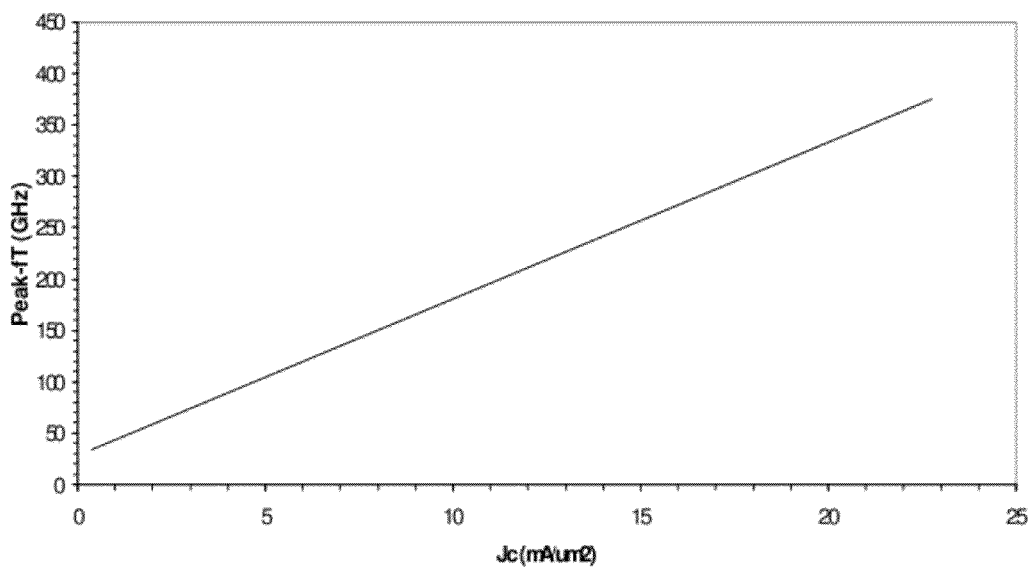
FIG. 6 shows a graph comparing peak fT to peak Jc.

FIG. 6 shows a graph comparing peak fT to peak Jc. In the graph of FIG. 6, the y-axis represents peak frequency (ff) in GHz and the x-axis represents current (Jc) in $mA/um^2$. As can be seen, the trend in more recent generations of SiGe technologies is to increase the peak frequency while increasing the required current density. In the present invention, the HBT peak current density is 25 $mA/\mu m^2$ (compared to conventional wires which have a peak current density of under 8 $mA/\mu m^2$). The present invention is advantageously able to achieve about 25 $mA/\mu m^2$ without increasing the wiring dimensions, or affecting other wiring layers.

Figure 7:
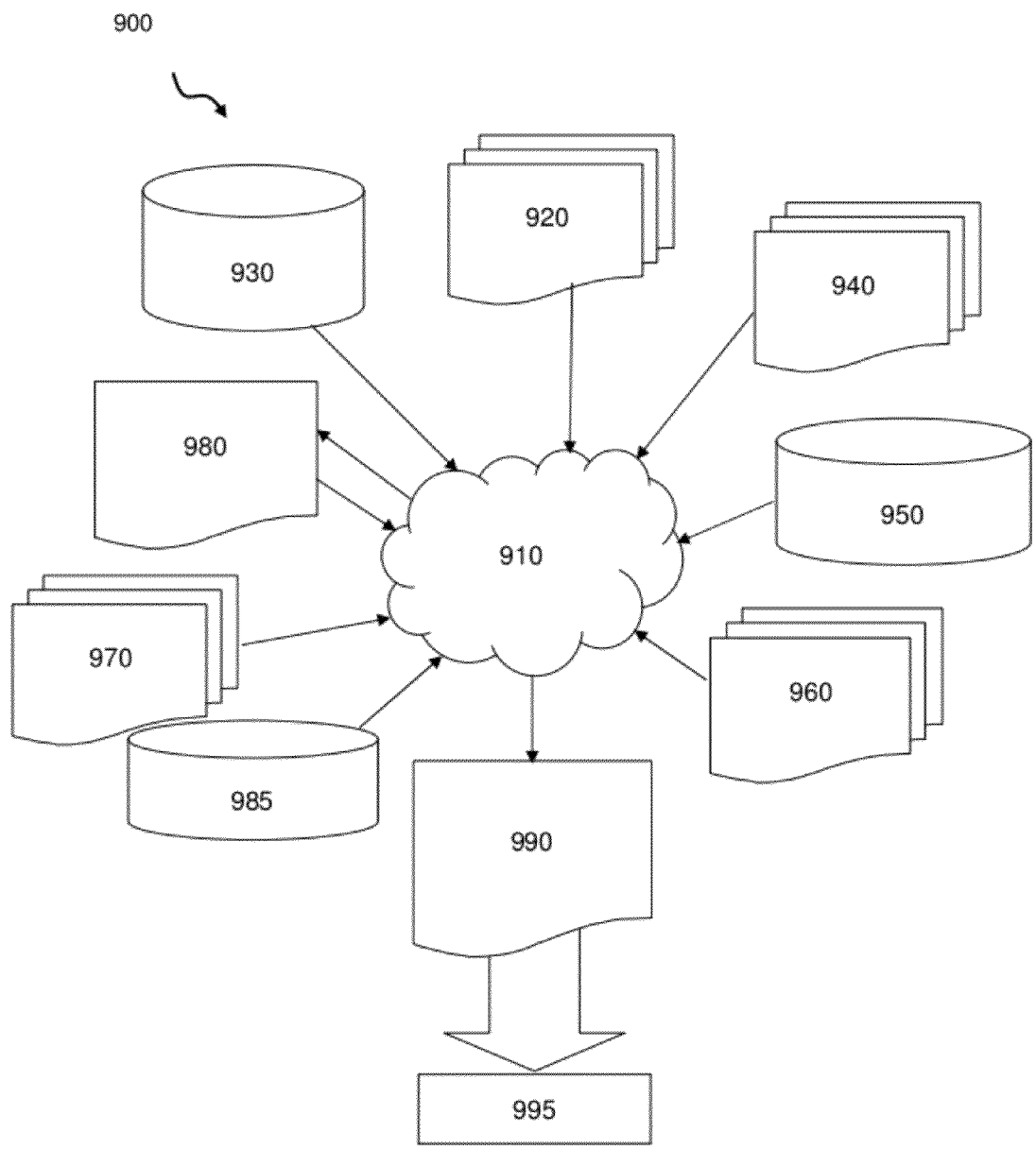
FIG. 7 is a flow diagram of a design process used in semiconductor design, manufacture, and/or test.

FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3 and 5, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3 and 5, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3 and 5, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3 and 5, for example. In one embodiment, design structure 990 may comprise a compiled, executable HDL simulation model that functionally simulates the devices shown in FIGS. 3 and 5, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3 and 5, for example. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure comprising: an HBT comprising a collector, base and emitter; wiring structures in electrical connection with the collector, base and emitter; a copper layer deposited on the wiring structures; a selective metal deposited on the copper layer, wherein the selective metal is CoWP; a FET adjacent to the HBT; a dedicated wiring structure comprising a tungsten or tungsten lined stud contact in direct contact with the FET; and a copper wiring structure devoid of the selective metal in direct contact with the tungsten or tungsten lined stud contact, wherein: the dedicated wiring structure is on a same wiring level as the wiring structures; and the selective metal deposited on the copper layer is provided above a surface of a dielectric layer in which the copper wiring structure and the copper layer are formed therein.

2. The structure of claim 1, wherein the base comprises SiGe.

3. The structure of claim 1, wherein the wiring structures are damascene tungsten stud contacts with TiN liner.

4. The structure of claim 1, wherein the wiring structures are damascene copper stud contacts with Ta liner.

5. The structure of claim 1, wherein the wiring structures are dual damascene tungsten structures.

6. The structure of claim 1, wherein the metal is one of TaN, TaN/Ta, Ru, W, Mn and TiN.

7. The structure of claim 1, wherein the copper wiring structure is dedicated to the FET.

8. A structure comprising: a first device connected to a metal wire comprising a metal cap layer on copper wiring structures, wherein the metal cap layer is CoWP; a second device connected to another metal wire on a same level as the metal wire of the first device and being devoid of the metal cap layer on other copper wiring structure; wherein: the another metal wire comprises a tungsten or tungsten lined stud contact in direct contact with the second device; the other copper wiring structure is in direct contact with the second device: the another metal wire is on a same wiring level as the metal wire; and the metal cap layer deposited on the copper wiring structures is provided above a surface of a dielectric layer in which the copper wiring structures and the other copper wiring structure are formed therein.

9. The structure of claim 8, wherein the first device is an HBT comprising a base, emitter and collector.

10. The structure of claim 9, wherein the base comprises SiGe.

11. The structure of claim 9, wherein the second device is a FET.

12. The structure of claim 8, wherein the metal cap layer is one of TaN, TaN/Ta, Ru, W, Mn and TiN.

13. The structure of claim 1, wherein the copper layer is deposited within individual trenches over each of the wiring structures.

14. The structure of claim 13, wherein the trenches are of a different dimension than the wiring structures.

15. The structure of claim 14, wherein the selective metal deposited above the trenches in which the copper layer is deposited.

16. The structure of claim 8, wherein:
the first device is an HBT;
the metal wire is formed in individual vias;
the copper wiring structures are formed in individual trenches, each having a dimension different than that of the via;
the second device is a FET;
the another metal wire is formed in another via; and
the copper wiring structures are formed in another trench with a dimension different than that of the another via.

17. The structure of claim 16, wherein the metal cap layer is deposited above the trenches in which the copper wiring structures are formed.

* * * * *